United States Patent [19]
Christensen et al.

[11] Patent Number: 5,648,719
[45] Date of Patent: Jul. 15, 1997

[54] MAGNETIC SENSOR WITH CHARACTERISTICS THAT ARE CHANGEABLE BY AN EXTERNAL MAGNETIC DEVICE

[75] Inventors: Timothy A. Christensen, Stephenson County; Wayne L. Ehlers, Carroll County; Kenneth L. Eichholz, Jr.; Thomas A. Fletcher, both of Stephenson County, all of Ill.

[73] Assignee: Honeywell Inc., Minneapolis, Minn.

[21] Appl. No.: 901,363

[22] Filed: Jun. 19, 1992

[51] Int. Cl.⁶ ........................................ G01B 7/14
[52] U.S. Cl. ........................ 324/207.26; 324/207.2
[58] Field of Search ............................ 324/202, 236, 324/207.12, 207.2, 207.24, 207.25, 207.26

[56] References Cited

U.S. PATENT DOCUMENTS

| | | |
|---|---|---|
| 4,334,204 | 6/1982 | Buchanan . |
| 4,433,309 | 2/1984 | Hermle et al. . |
| 4,691,185 | 9/1987 | Loubier et al. ............... 324/202 |
| 4,742,217 | 5/1988 | Wilwerding . |
| 4,796,966 | 1/1989 | Kovaleski et al. . |
| 4,800,238 | 1/1989 | Gesvent . |
| 5,144,234 | 9/1992 | Murata ....................... 324/207.2 |

*Primary Examiner*—W. Snow
*Attorney, Agent, or Firm*—William D. Lanyi; John G. Shudy, Jr.

[57] ABSTRACT

A sensor is provided for changing an operational characteristic of a circuit within a housing structure of the sensor to a preselected stimulus. The circuit within the housing structure is provided with magnetically sensitive components to change an operational parameter thereof. An object is provided to change the status of the magnetically sensitive component. The present invention incorporates a Hall effect element within the housing structure that is placed proximate a permanent magnet. Between the magnet and the Hall effect element a depression is formed to permit the insertion of a magnetically permeable object to change the magnetic field. The change in the magnetic field creates a change in the status of the Hall effect element and permits the circuit to change its operational characteristic.

6 Claims, 7 Drawing Sheets

MAGNETIC SENSOR WITH CHARACTERISTICS THAT ARE CHANGEABLE BY AN EXTERNAL MAGNETIC DEVICE

BACKGROUND OF THE INVENTION

1. Field of the Invention

The present invention relates generally to sensors, such as proximity sensors or photoelectric devices, which are externally programmable to alter an operating characteristic of the sensor and, more particularly, to sensing devices of this type which utilize externally located magnetic components or magnets to alter an operationally characteristic response of an electronic circuit disposed within the sensor body in order to change the response of the sensor to a predetermined stimulus.

2. Description of the Prior Art

Many different types of sensing devices are known to those skilled in the art. For example, certain types of proximity sensors operate to detect magnetic material within a zone proximate a portion of the sensor. In other systems, photoelectric devices are used to detect the presence or absence of an object within a zone through which a light beam is directed.

U.S. Pat. No. 4,433,309, which issued to Hermle et al on Feb. 21, 1984, describes a proximity switch that is provided with a built-in test circuit. It illustrates a circuit for an inductive proximity switch that comprises a built-in testing capacity for monitoring moveable elements in which an oscillator has an inductive control element. The impedance of the inductive control element varies in response to approaching elements with a built-in electrical tester for monitoring the correct functioning of the proximity switch, wherein the tester has an electrically switchable damping circuit for damping the oscillator for test purposes.

U.S. Pat. No. 4,800,238, which issued to Gesvent on Jan. 24, 1989, describes an electronic device, such as a sensor, which has a housing with a pivoted adjustment access sealing cover in which the cover is hinged by means of a laterally oriented pivot portion held captive in recesses cooperatively formed by the housing and a retainer. The housing and the retainer are formed of the same ultrasonically weldable material and are ultrasonically welded together. The cover is formed of a material different from the material of the housing and retainer to resist ultrasonic welding and remain free for pivotal movement.

U.S. Pat. No. 4,334,204, which issued to Buchanan on Jun. 8, 1982, discloses a proximity switch assembly in which the self contained assembly is of the type which indicates the status of a moveable mechanical structure, such as a door, being in proper position for latching. It includes a proximity sensor mounted to a base plate. Also mounted to the base plate is a plunger mechanism which carries a target plate. Upon the striker surface of the plunger engaging an external object, the target plate moves into proximity with the sensor and thereby produces a status signal.

U.S. Pat. No. 4,796,966, which issued to Kovaleski et al on Jan. 10, 1989, describes a magnetically activated fiber optic switch. The switch is provided for regulating light transmission comprising an encasing movement bodies surrounding a paramagnetic shaft, a section of which protrudes therefrom. A spring member surrounds the shaft protruding from the encasing movement body. At the end of the shaft opposite that of the protruding section is a light intercepting surface that is alienable with an end surface of at least one optical fiber. When a magnet outside the encasing body approaches sufficiently close to the shaft, magnetic forces attract the shaft overcoming the restraining spring and cause the light intercepting surface to move out of alignment with ends of the optical fiber and thereby makes or breaks a light circuit.

U.S. Pat. No. 4,742,217, which issued to Wilwerding on May 3, 1988, discloses a projection alignment and focusing aide. The device is used to assure that a detector array receives a properly focused image from a predetermined area. The image is of a remote object. The device provides an elongated radiation source that is located at an optical position which is indicative of the location of the detector array. It uses a partly reflective mirror in the path between the object and the array for the purpose of projecting radiation from the source to the object so that the proper focus condition and the desired area may be adjusted by focusing and positioning the image of the radiation source on the object.

Many different types of sensors, such as those described above, are used to detect the presence or absence of an object and, in some situations, to detect the distance of an object from a predefined location. For each particular application of a sensor, several operational characteristics of the sensor must be determined prior to installing the device in conjunction with associated equipment. For example, it must be initially decided whether the circuitry of the sensor, whether the sensor is a proximity sensor or a photoelectric device, is to operate as a normally open or normally closed switch. Furthermore, the operational range of the sensor must be determined. Additionally, it must be decided whether the circuitry of the sensor should sink or source electric current. Other initial parameters can relate to diagnostic capabilities, short circuit protection and TTL capability.

One approach to satisfying these requirements is to provide many different types of sensors. In other words, the user of the sensors could stock a predetermined number of sensors that operate as normally open switches and another predetermined number of sensors that operate as normally closed switches. Similarly, both extended range sensors and standard range sensors could be maintained in inventory and sensors that sink current would be stored along with sensors that source current. The requirement to maintain an inventory stock of many different types of sensors that are each basically the same in operation, but exhibit different operational characters in response to a stimulus, is both expensive and wasteful.

It is known to those skilled in the art that a sensor can be provided with selective switching that changes the response characteristics of the sensor to preselected stimuli. However, this capability typically requires the provision of switches connected to the sensors that permit the operator to selectively change the operationally characteristic response during initial installation in conjunction with associated equipment. The inclusion of switches to permit the selectability of operational characteristics unfortunately creates an additional problem. Switches of this type require that a breach be provided in the housing of the sensor. Any opening of this type in the housing makes the sensor vulnerable to the passage of deleterious fluids through the switch openings to the internal portion of the sensor where its circuitry is contained. This vulnerability is particularly disadvantageous in applications where the sensor is required to withstand a periodic washdown wherein high pressure fluids are directed against the outer surface of the sensor. If selectable switching is provided that requires a breach in the outer housing of the sensor, the high pressure washdown will cause fluids to pass into the internal portion of the sensor housing and have a damaging effect on the operational integrity of the internal circuitry.

If would therefore be significantly beneficial if a sensor could be provided which comprises a waterproof housing without any openings in it while also providing the capability of changing the operational characteristics of the internal circuitry to change the response of the circuitry to predetermined stimuli.

SUMMARY OF THE INVENTION

The present invention provides a means by which a sensor, such as a proximity sensor or a photoelectric device, can be effected in such a way that its operational characteristics in response to a predetermined stimulus can be selectively altered without the accompanying requirement of providing an opening in the housing of the sensor. A preferred embodiment of the present invention comprises a housing structure that is generally impermeable to fluids. An electronic circuit is disposed within the housing structure and configured to respond to a preselected stimulus according to a first operational characteristic. This response can be the opening of a switch or the closing of a switch. It can be the sensing of an object within an extended range proximate the sensor or the sensing of an object within a standard range relative to the sensor. It can be the sinking of current or the sourcing of current. It can be the operation according to a diagnostic routine or according to a normal sensing routine.

The electronic circuit of the present invention comprises a component that is operatively associated with the circuit to change the first operational characteristic of the circuit to a second operational characteristic in response to a change of condition of the component. For example, if the sensor is originally initialized to be normally open and to close a switch in response to a stimulus, the characteristic can be changed so that the sensor is normally closed but opens a switch in response to the same stimulus. The circuit component of the present invention which allows this change in operational characteristics is a magnetically sensitive device in a preferred embodiment. The magnetically sensitive device can be a Hall effect element or, alternatively, a reed switch.

The preferred embodiment of the present invention also comprises a means which is external to the housing for changing the condition of the component. In other words, a magnet can be disposed external to the housing and moved relative to the housing so that it moves into a position which changes the status of the switch. If the circuit component is a Hall effect sensor, it can be effected in this matter by moving an external magnet proximate the Hall effect sensor or, alternatively, by disposing both an internal magnet and Hall effect sensor within the housing structure and providing an external means for disposing a magnetically permeable material in a depression of the housing between the internal magnet and the Hall effect element. As will be described in greater detail below, either of these optional arrangements is possible within the scope of the present invention.

Alternative configurations of the present invention can dispose a magnet external to the housing structure and attached to a component that is moveable in relation to the housing. For example, a nut with a magnet disposed therein can be threaded in mesh association with an external threaded surface of the housing. By rotating the nut relative to the housing, the permanent magnet disposed in the nut can be moved circumferentially in a spiral path around the housing to have an effect on components, such as Hall effect elements or reed switches, disposed at preselected locations within the housing. Alternatively, a magnet can be attached to a rotatable tail piece disposed at one external position relative to the housing of the sensor. Optionally, one alternative embodiment of the present invention provides a generally cylindrical depression in the sensor housing and disposes a rotatable magnet within the depression so that rotation of the magnet within the depression formed in the housing wall can selectively change the status of a magnetically sensitive switch disposed within the housing itself proximate the depression.

Through its various embodiments, the present invention permits a sensor to be changed with respect to its operationally characteristic response to a predefined stimulus. This change in response can be caused without requiring a breach in the wall of the sensor housing and therefore can be implemented without creating a vulnerability to seepage of fluids into the internal circuitry of the sensor within the housing.

BRIEF DESCRIPTION OF THE DRAWINGS

The present invention will be more fully understood from a reading of the Description of the Preferred Embodiment in conjunction with the drawing, in which.

DESCRIPTION OF THE PREFERRED EMBODIMENT

Throughout the Description of the Preferred Embodiment of the present invention, like reference numerals will be used to identify like components.

The concepts of the present invention can be utilized in conjunction with sensors of many different types. For example, proximity sensors which apply magnetic principles to the detection of components within a predefined range proximate the sensor can be associated with the present invention in order to permit a change in the response of the proximity sensor to a preselected stimulus. As described above, the present invention can be used to change the reaction of the proximity sensor in response to the presence of an object within its range by having the sensor close a switch instead of having the sensor open a switch in response to this stimulus. Other types of operational characteristics were also described above, such as the choice of having the sensor sink current or source current, employ an extended range or a normal range and several other optional choices. By employing this type of operational flexibility provided by the present invention, only a minimum number of different types of proximity sensors need to be stocked in inventory rather than a stocked supply of each different optional response type of sensor. The present invention can equally be associated with a photoelectric sensor to change its operational parameters. Therefore, while FIG. 1 is used to illustrate a typical circuit application in which the present invention can be used and FIG. 1 is a circuit that directly relates to a proximity sensor application, it should be understood that the exemplary circuit shown in FIG. 1 could be replaced with a typical photoelectric sensing circuit in other applications.

Figure 1:
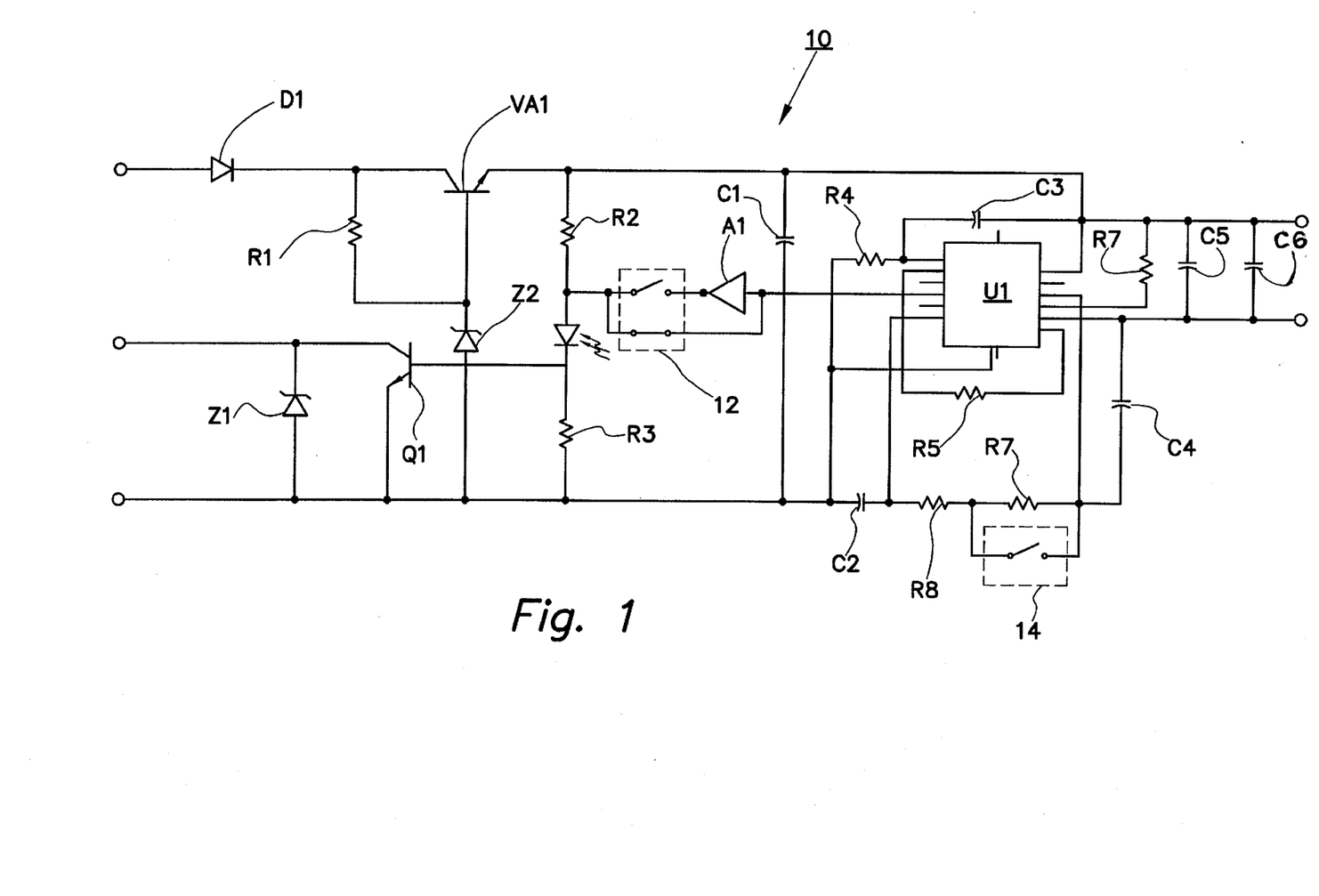
FIG. 1 shows an exemplary electronic circuit of a sensor with which the present invention can be employed.

The circuit shown in FIG. 1 is particularly applicable in one specific application of a proximity switch. The components illustrated in FIG. 1 are identified in Table I below.

TABLE I

| Reference identification | Value or type |
| --- | --- |
| R1 | 3.9 KΩ |
| R2 | 2 KΩ |
| R3 | 4.7 KΩ |
| R4 | 228 KΩ |
| R5 | 220 KΩ |
| R7 | 100 KΩ |
| R8 | 15 KΩ |
| C1 | 0.47 uF |
| C2 | 220 pF |
| C3 | .882 uF |
| C4 | 330 pF |
| C5 | 888 pF |
| C6 | 820 pF |
| Z1 | FE-00008(50 V) |
| Z2 | FE-45745(6.8 V) |
| D1 | IN4005 |
| VA1 | 2C2222A |
| Q1 | 2C2222A |
| V1 | ECKO-IV-MOD |
| A1 | 74AC04 |

Although the operation of the circuit in FIG. 1 is generally known to those skilled in the art and will not be described in detail herein, it should be noted that two portions of the circuit are provided with switches that can create a preselected change in the operationally characteristic response of the circuit. For example, reference numeral 12 identifies a pair of switches associated with the component identified by reference numeral A1. As can be seen, two oppositely configured switches can be used to select the passage of the signal through the invertor A1 or the bypassing of the invertor A1. If component 12 is activated, the signal is passed through the invertor A1. Otherwise, if the device 12 is not activated the signal bypasses the invertor. The pair of switches identified within the dashed box 12 are magnetically sensitive and can be reed switches. They are used in the circuit of FIG. 1 to determine whether or not the device that incorporates the circuit of FIG. 1 is normally open or normally closed.

Another dashed box 14 illustrates a magnetically sensitive device disposed in association with resistor R7. If the switch of device 14 is opened, the current passes through resistor R7. Alternatively, if the switch of device 14 is closed, current will bypass resistor R7. In this particular application of device 14, the operate point of the proximity sensor can be changed. In a preferred embodiment of the present invention, the switch of device 14 can be a magnetically sensitive reed switch. As discussed above, the circuit in FIG. 1 is used as an example to illustrate two particular applications of the present invention. One application is identified by reference numeral 12 and is used to change the normally open or normally closed characteristic of the sensor. The other application is identified by reference numeral 14 and uses a magnetically sensitive component to change the operate point by either passing current through resistor R7 or bypassing the resistor.

Figure 2:
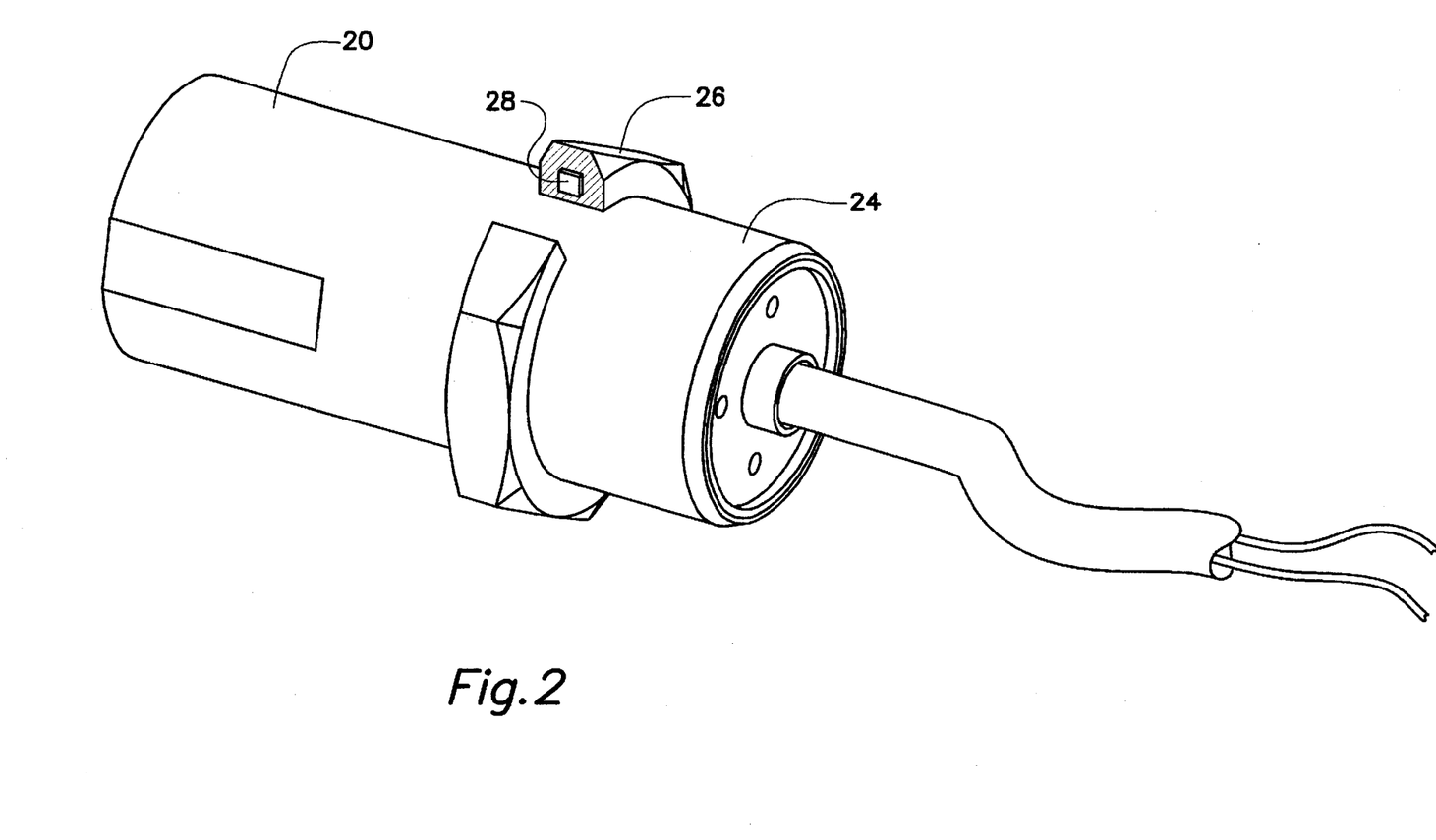
FIG. 2 shows one embodiment of the present invention which uses a nut with a permanent magnet.

FIG. 2 illustrates a particular embodiment of a housing used to contain the circuit of a sensor, such as the circuit shown in FIG. 1. The housing 20 is used to contain and protect the circuit components of a sensor, such as a proximity sensor or a photoelectric device. Although not illustrated in FIG. 2, it should be understood that the outer surface 24 of the housing 20 is threaded. A nut 26 is associated in mesh relation with the threads on the outer surface 24. By rotating the nut 26 relative to the housing, the nut will move axially along the cylindrical body of the sensor and will rotate circumferentially along a spiral path about the outer surface 24. According to one embodiment of the present invention, a permanent magnet 28 is disposed within the nut 26 so that rotation of the nut 26 will cause the magnet 28 to move about the housing structure and change its position proximate components disposed within the housing 20. When the magnet 28 moves proximate a magnetically sensitive component disposed within the housing 20, such as the components identified by reference numerals 12 and 14 in FIG. 1, the magnetic field of the magnet 28 will cause the magnetically sensitive component to operate and thus change a preselected operational characteristic of the circuit.

Figure 3:
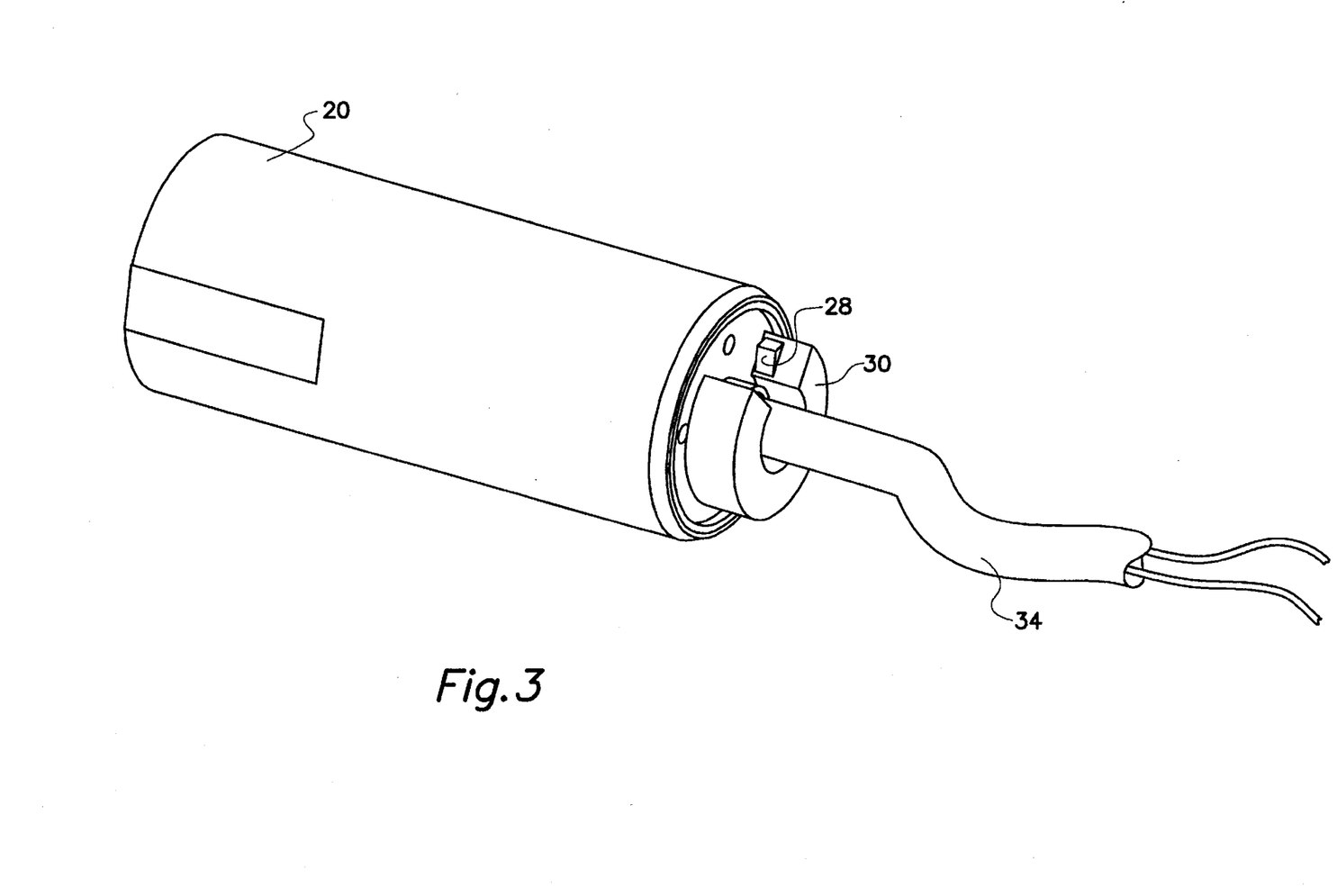
FIG. 3 shows an alternative embodiment of the present invention which uses a tail piece with a permanent magnet.

FIG. 3 shows an alternative embodiment of the present invention in which a tail piece 30 is rotatably attached to the housing 20 at one axially end thereof. Detents are provided to permit the tail piece 30 to rotate and stop at selected arcuate positions relative to the housing. The permanent magnet 28 disposed within the tail piece 30 is thus moved around a centerline of the sensor at the end of the housing structure 20. The magnetically sensitive components in this embodiment would be disposed within the housing structure, but proximate the end of the sensor where the tail piece 30 is located. As in FIG. 2, a conductor 34 is provided in a typical sensor of the type shown in FIGS. 2 and 3 for the purpose of providing electrical power and signal communication between the sensor and an external device.

Figure 4:
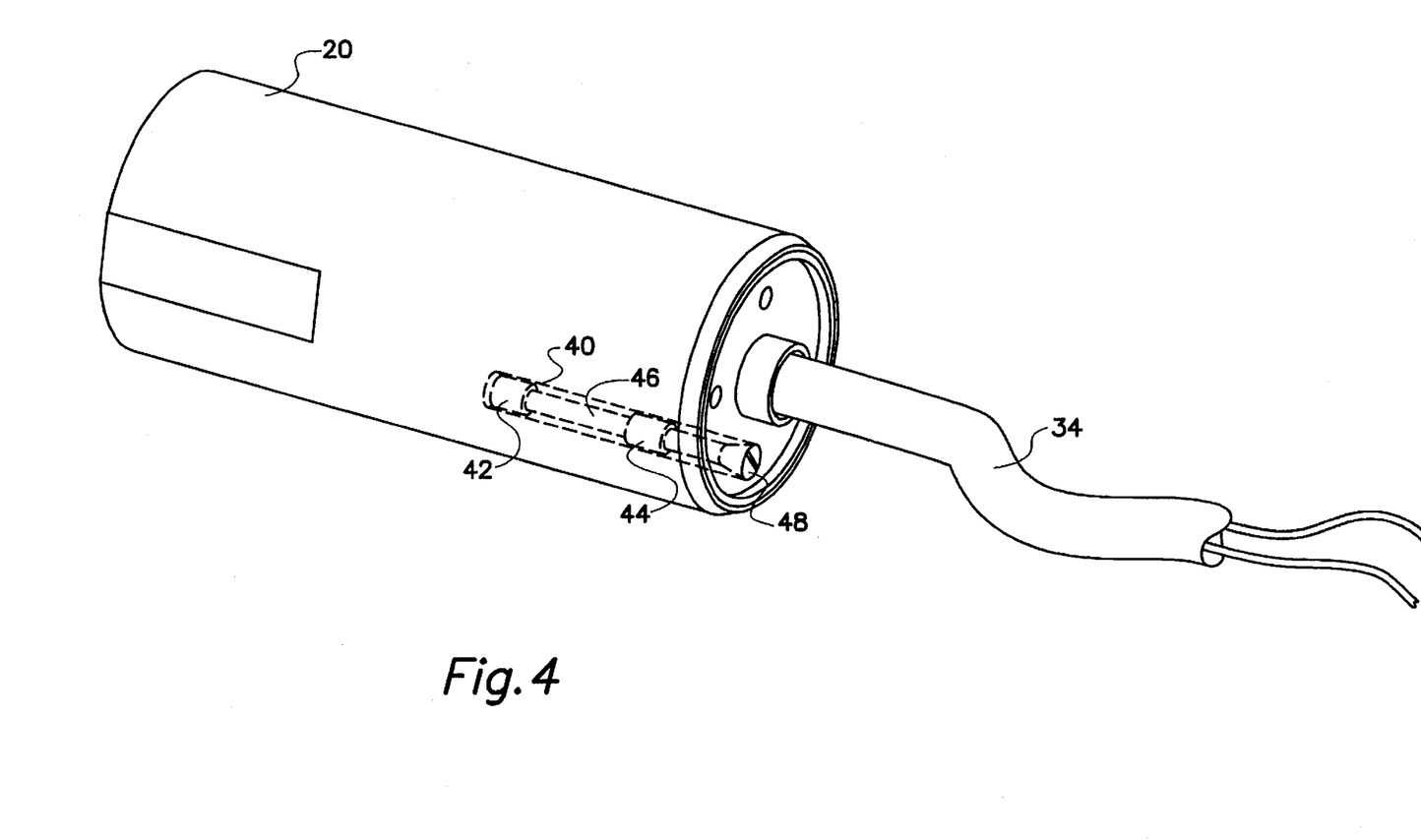
FIG. 4 shows an alternative embodiment of the present invention with a magnetic structure disposed within a depression formed in a wall of the housing structure.

In FIG. 4, a sensor housing 20 is provided with a depression 40 in the wall of the housing. The depression extends into the main body of the sensor, but is not in fluid communication with the internal portion of the structure. Instead, a depression 40 is formed in the wall of the housing structure 20 to accommodate components within the depression. The depression shown in FIG. 4 is illustrated by dashed lines and is generally cylindrical. Within the cylindrical depression 40, one or more magnet structures are disposed. In the particular embodiment illustrated in FIG. 4, two magnet structures, 42 and 44, are attached to a rotatable shaft 46. Rotation of shaft 46 is facilitated by a slotted end section 48. As can be seen in FIG. 4, rotation of the slotted end section 48 will cause the shaft 46 to rotate and also cause the two magnetic pieces, 42 and 44, to rotate within the depression 40. It should clearly be understood that none of the components identified by reference numerals 42, 44, 46 or 48 are in fluid communication with the internal portion of the housing structure 20 where the electronic circuitry of the sensor is disposed. A wall portion of the sensor housing is disposed around the depression 40 to seal the portion inside the depression 40 from the internal cavity of the housing structure where the circuitry is contained.

If magnetically sensitive components are disposed within the cavity of the housing structure proximate the wall portion that is shaped to provide the depression 40, rotation of the magnetic elements 42 and 44 can have an effect on the magnetically sensitive components and change their status. For example, with reference to FIGS. 1 and 4, if the magnetically sensitive component 12 is disposed proximate the magnetic element 42 and magnetically sensitive component 14 is disposed proximate magnetic element 44, rotation of shaft 46 can be used to create an effect whereby both magnetically sensitive components can be changed. By appropriately configuring both of the magnetic elements, 42 and 44, various combinations of changes can be created. For example, FIG. 5 is a detailed illustration of the structure shown disposed within depression 40 in FIG. 4.

Figure 5:
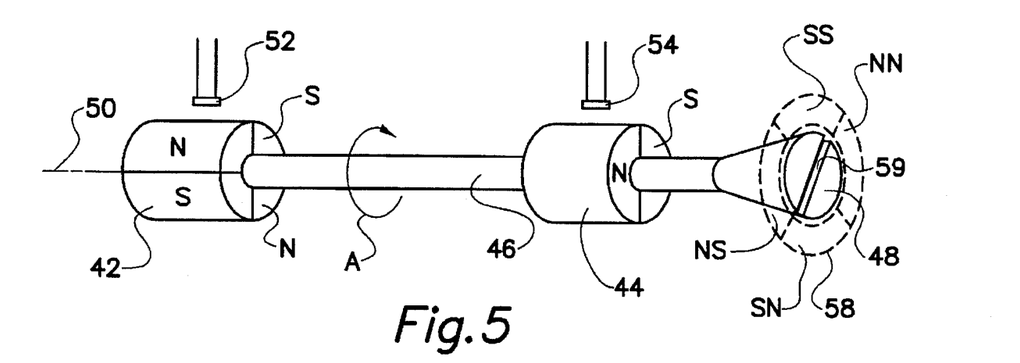
FIG. 5 shows a detailed illustration of the magnetic device illustrated in FIG. 4.

As can be seen in FIG. 5, the first magnetic element 42 comprises four magnetic poles disposed for rotation about the centerline 50 in response to rotation of shaft 46. Magnetic component 44 comprises two magnetic poles that are configured to rotate about centerline 50 in a similar manner. Two magnetically sensitive components are shown associated with the magnets in FIG. 5. Reference numeral 52 identifies a first magnetically sensitive component that is disposed proximate the magnetic element 42 so that the component 52 is within the magnetic field created by the magnetic element 42. Similarly, a magnetically sensitive device identified by reference numeral 54 is disposed proximate magnetic element 44. To illustrate the capabilities of the embodiment of the present invention illustrated in FIGS. 4 and 5, dashed lines have been employed to illustrate the rotational positions of the shaft 46 and the affect on the magnetically sensitive components, 52 and 54, resulting from those positions. Dashed lines 58 show four zones of rotation. Using the slot 59 as a pointer, it can be seen that the rotation of shaft 46, in the direction indicated by arrow A, will first place a north magnetic pole of magnetic component 42 proximate device 52 and a north magnetic pole of magnetic component 44 proximate device 54. This will place the system in the zone identified as NN. Continued rotation of the shaft 46 will place a south magnetic pole of magnetic component 42 proximate device 52 while the north magnetic pole of magnetic component 44 remains proximate magnetically sensitive component 54. This is identified as zone SN in FIG. 5. As can be seen, continued rotation of the shaft 46 will sequentially place the system in zones NS and SS. The initials used to identify the zones identify the poles of the magnetic components, 42 and 44, that are proximate the magnetically sensitive device, 52 and 54, respectively. It should be apparent from the above description that four combined statuses are possible with respect to this exemplary discussion. If, for example, the first magnetically sensitive component 52 in FIG. 5 is the magnetically sensitive component 12 shown in FIG. 1, the north pole of magnetic component 42 could, hypothetically, cause the proximity sensor of FIG. 1 to be in the normally open state. Also, the magnetically sensitive component 54 could hypothetically be the same as the magnetically sensitive component 14 in FIG. 1. In that case, it might be assumed that the north magnetic pole would cause magnetically sensitive component 54 to achieve an extended range. It can then be seen that successive rotation of shaft 46 would sequentially place the sensor circuitry in a normally open/extended range, normally closed/extended range, normally open/standard range and normally closed/standard range. These four combinations could facilitate the initialization of the sensor. It should be understood that additional magnetic components could be attached to shaft 46 to select operational characteristics other than those used in the above example.

Figure 6:
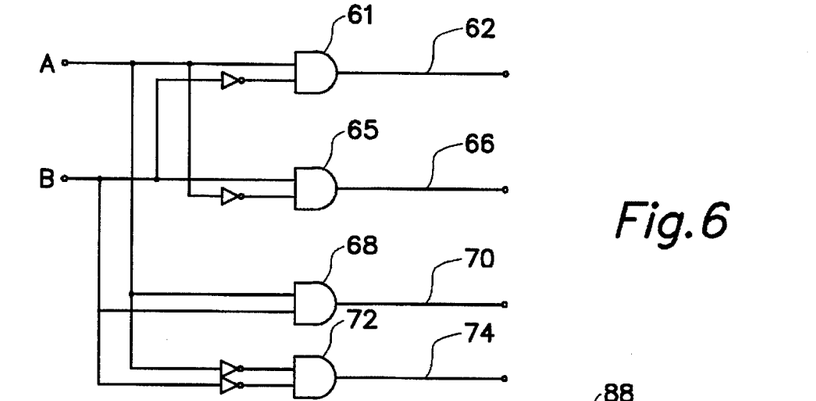
FIG. 6 is an exemplary logic circuit showing the possible combinations available with the present invention shown in FIG. 5.

By appropriately selecting the number of magnetic poles provided with magnetic elements 42 and 44, the combinations of possible characteristics can be provided as described above. To illustrate this capability more generically, FIG. 6 provides a logic circuit that shows how the magnetic characteristics of the two devices can be used to select various combinations of circuit parameters to alter the operational characteristics of the circuit. With reference to FIGS. 5 and 6, reference letter A is used to represent a particular status of magnetically sensitive component 52 and reference letter B is used to represent the status of another magnetically sensitive component 54. For example, if a north magnetic pole is proximate either of the magnetically sensitive components, its status could hypothetically be assumed to be "high". Alternatively, if a south magnetic pole is proximate either of the magnetically sensitive devices, its status can be assumed to be "low". Using this convention, FIG. 6 shows how the magnetically effected status of the two magnetically sensitive components can be used to provide the four combinations of operating characteristics. For example, if the condition A of the first magnetically sensitive device 52 is high and the condition B of the second magnetically sensitive component 54 is low, AND gate 61 will provide an output signal on line 62 representing this position. If an opposite condition, is present, with output B high and output A low, AND gate 65 will provide a signal on line 66. If both output signals from the magnetically sensitive devices, 52 and 54, are high, a output signal from AND gate 68 will be provided on line 70. Finally, if both output signals, A and B, are low, AND gate 72 will provide a signal on line 74. The simplified exemplary circuit in FIG. 6 in conjunction with the illustration of FIG. 5 shows the capability and flexibility of the present invention to create a desired effect in the operational characteristic of an electronic circuit without requiring direct contact, either physical or electrical, between the means for causing the change and the component which implements the change. In other words, the permanent magnets attached to shaft 46 in FIG. 5 are the means for causing the change and the magnetically sensitive components, 52 and 54, are the means for implementing the desired change. It should be understood that the magnetically sensitive components illustrated in FIG. 5 are separated from their associated rotatable magnet elements, 42 and 44, by a wall of the housing structure. In other words, with reference to FIGS. 4 and 5, the dashed cylindrical shape represented by line 40 could be disposed around the rotatable members in FIG. 5 and provide a separation between those members and the magnetically sensitive devices.

Figure 7:
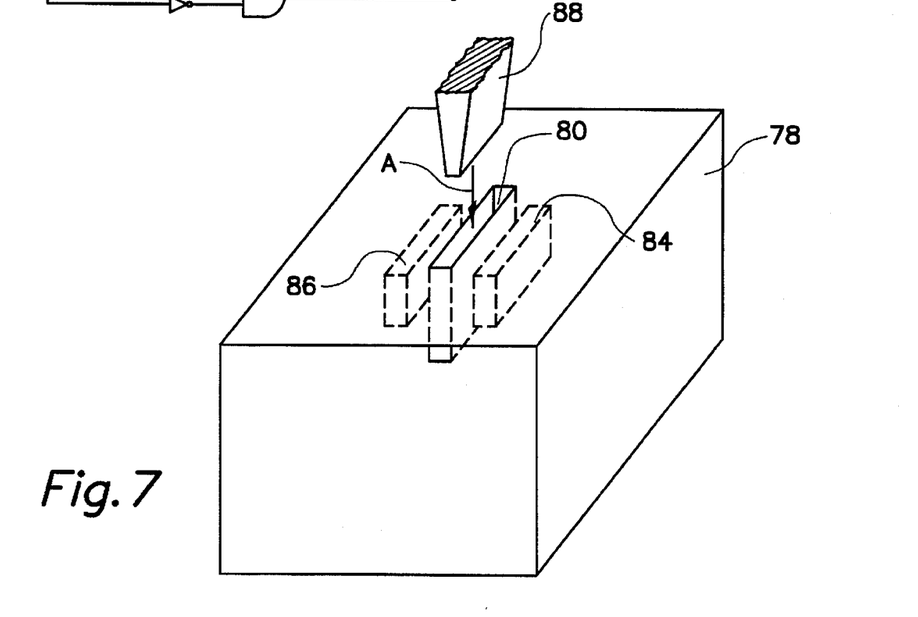
FIG. 7 shows an alternative embodiment of the present invention arranged with means for a magnetically permeable object to be utilized external to a sensor to change its characteristics.

An alternative embodiment of the present invention is illustrated in FIG. 7. A sensor component 78, such as a proximity switch or photoelectric device, is provided with a depression 80 that is formed in the outer wall of the housing structure of the sensor 78. The depression 80 is formed in the shape of a "pocket" that allows an external object to be disposed therein without permitting that external object to move into direct contact with any of the components contained within the housing structure of the sensor. The shape and configuration of the depression 80 is comparable to the depression 40 shown in FIG. 4. Although the depression 80 is generally rectangular in shape while the depression 40 is cylindrical, they both are formed by portions of the wall of the housing structure that are shaped to extend toward the inner portion of the housing structure without permitting fluid communication to pass therethrough.

In FIG. 7, the depression 80 is shown disposed between a permanent magnet device 84 and a magnetically sensitive component 86. The depression 80 extends into the body of the housing structure between the magnet 84 and the magnetically sensitive device 86. If the depression 80 is empty, the magnetic field provided by the magnet will pass through the opening of depression 80 and provide a preselected effect on the magnetically sensitive component 86. However, as is well known to those skilled in the art, a magnetically permeable object disposed between a magnet and a magnetically sensitive component will distort the magnetic field and change the resulting effect on the component. The purpose of depression 80 is to permit an operator to dispose a magnetically permeable object, such as the screwdriver blade 88, into depression 80 for the purpose of distorting the field and providing the above described effect. In other words, insertion of a magnetically permeable member in the direction identified by arrow A in FIG. 7 will cause the magnetically sensitive component 86 to sense the change in the magnetic field proximate it. The sensing of that change will cause the component to change a parameter of the operating characteristic of a related circuit that is connected in communication with it. For example, the magnetically sensitive device 86 shown in FIG. 7 could be either device 12 or 14 shown in FIG. 1. In an arrangement such as that shown in FIG. 7, the magnetically sensitive device 86 can also be a Hall effect element arranged in association with a permanent magnet on opposite sides of the depression 80. The signal from the Hall effect element can easily be used within a logic circuit to implement the types of changes in operational characteristics described herein. These capabilities are well within the knowledge of those skilled in the art for the purpose of implementing a Hall effect element in an electronic circuit.

Figure 8:
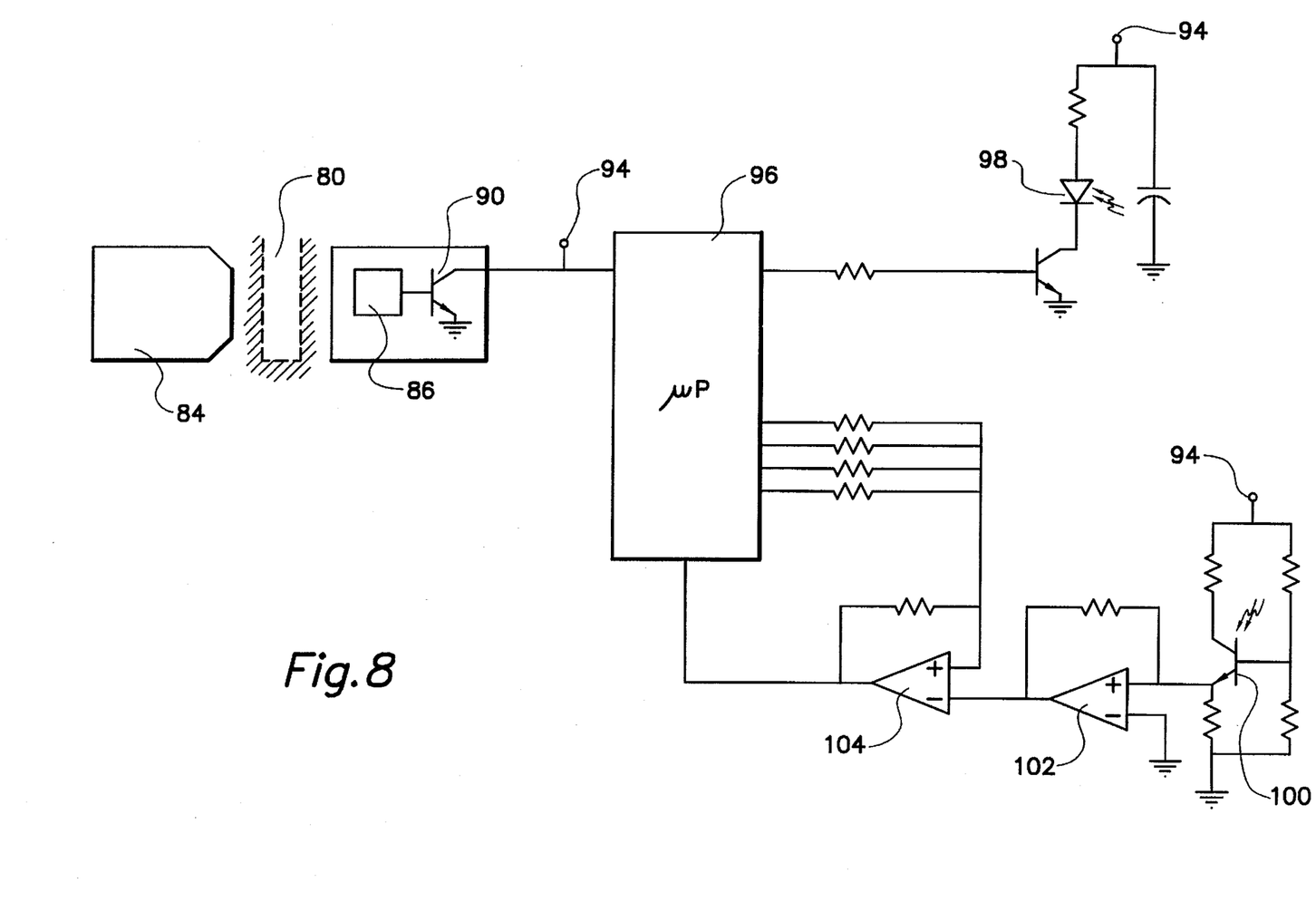
FIG. 8 illustrates an electronic schematic circuit showing an implementation of the embodiment illustrated in FIG. 7.

FIG. 8 shows a simplified schematic illustration of an implementation in which the type of configuration shown in FIG. 7 is employed. The permanent magnet 84 is disposed on an opposite side of a depression 80 from a Hall effect element 86 which is associated with a solid state switch 90 as shown. If the collector of switch 90 is connected to a source of voltage 94 as shown in FIG. 8, the Hall effect element 86 can provide a signal to a microprocessor 96. The other components, such as the resistors, the LED 98, the capacitor, the photosensitive component 100, the amplifier 102 and the comparator 104 are associated with the microprocessor 96 to implement the changes in operational characteristics requested by insertion of a magnetically permeable device into the depression 80. FIG. 8 is schematic in nature and it should be understood that the simplified circuit in FIG. 8 is intended as an illustration of the device shown in FIG. 7 and is not limiting in the type of circuit that is applicable in association with the present invention.

Figure 9:
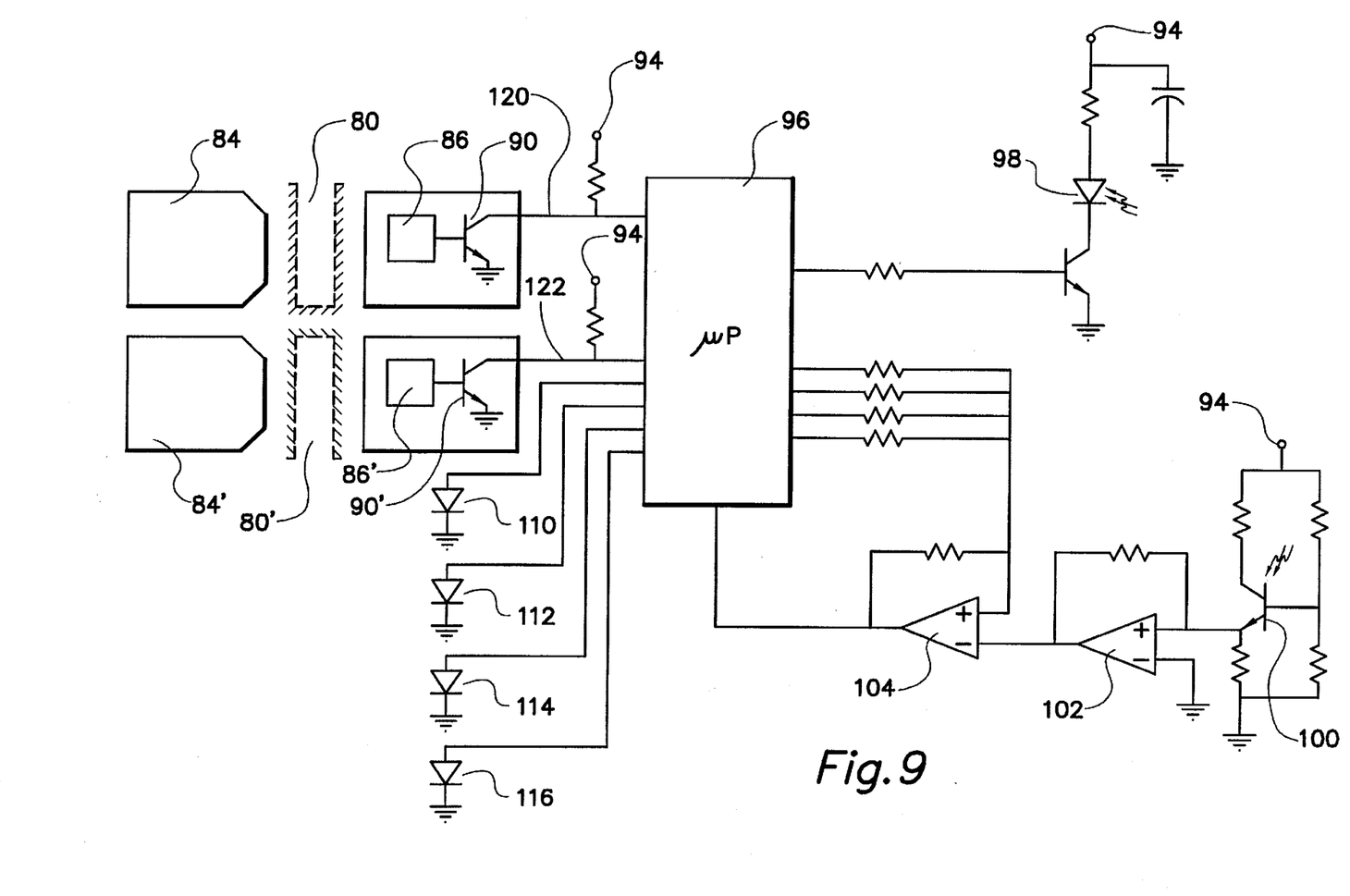
FIG. 9 shows an embodiment of the present invention utilizing two pairs of components.

In the above description of FIGS. 4 and 5, it was explained that more than one magnetic element could be used so that a plurality of status changes could be implemented in accordance with the present invention. FIGS. 7 and 8 show a single slot 80 associated with a single pair of devices, such as the permanent magnet 84 and the Hall effect 86, to implement a single status change in the operational characteristics of a circuit. FIG. 9, on the other hand, shows this concept employed to change a plurality of operational characteristics. The similarities between FIGS. 8 and 9 are apparent. The differences between these Figures account for the implementation of a second pair of components, such as the permanent magnet 84' and the second Hall effect element 86'. Other than the inclusion of the second pair of components, 84' and 86', in association with the microprocessor 96, the illustration in FIG. 9 is functionally identical to the illustration in FIG. 8. The four diodes, 110–116, are shown connected to the microprocessor 96 for the purpose of illustrating that four options are available through the use of the two pairs of components shown in the embodiment illustrated in FIG. 9. It should be understood that the logic circuit shown in FIG. 6 could be implemented in software by the microprocessor 96 and, therefore, the two arrangements provided in FIG. 9 can each provide a high or low signal to the microprocessor. This facilitates the provision of four options in a manner very similar to that shown in FIG. 6. To implement the embodiment of the present invention shown in FIG. 9, an operator would first dispose a magnetically permeable object into slot 80 to provide a signal to the microprocessor 96. This process would be performed until the signal on line 120 causes the microprocessor to select the desired characteristic. The procedure would be continued by disposing the magnetically permeable object into slot 80' so that the microprocessor could receive a signal on line 122. The combination of insertions of the magnetically permeable object into slots 80 and 80' would be performed to select the desired option from the choice of four options. As one skilled in the art will appreciate, the implementation of a microprocessor significantly facilitates the use of the present invention. In other words, repeated insertions of a magnetically permeable object, such as a screwdriver blade, into the slot 80 can be interpreted by the microprocessor 96 as an incremental signal which would increase a parameter each time the magnetic characteristic of the magnetically sensitive device 86 changes. Regardless of the specific implementation of the present invention, its basic function is to permit an operationally characteristic response of an electronic circuit to be changed through the use of an external device without requiring an opening to be provided in the wall of the housing structure.

Numerous examples of implementations of the present invention have been described and illustrated above. In addition, several embodiments of the present invention have been illustrated with significant specificity. However, it should be understood that the embodiments described above represent only a few of those which are possible within the scope of the present invention.

The embodiments of the invention in which an exclusive property or right is claimed are defined as follows:

1. An electronic device, comprising:

a housing;

an electronic circuit disposed within said housing and configured to respond to a preselected stimulus according to a first operational parameter, said circuit comprising a component operatively associated with said circuit to change said first operating parameter of said circuit to a second operating parameter in response to a change of condition of said component, said component being magnetically sensitive, said condition being changeable in response to a change in the magnetic field proximate said component;

a magnet disposed within said housing proximate said component, said magnet being spaced apart from said component by a preselected gap; and a depression formed in a wall of said housing and extending into said preselected gap, said depression being shaped to receive a magnetic object therein, said magnetic object being external to said housing and being disposable between said magnet and said component and within said preselected gap to affect the magnetic flux of said magnet proximate said component.

2. The device of claim 1, wherein:

said device is a sensor.

3. The device of claim 2, wherein:

said device is a proximity sensor.

4. A sensor, comprising:

a housing structure;

an electronic circuit disposed within said housing structure, said circuit comprising means for responding to a predefined stimulus according to a predetermined operational parameter;

a magnetically sensitive component connected in electrical communication with said circuit for changing said predetermined operating parameter of said circuit in response to a change in magnetic field strength proximate said component;

means external to said housing structure for changing said magnetic field strength proximate said component;

a magnet disposed within said housing structure proximate said component, said magnet and said component being spaced apart to define a gap therebetween; and a depression formed in a wall of said housing structure, said depression extending inward within said gap, said depression being shaped to receive a magnetic object therein, said magnetic object being disposable within said gap to change the magnitude of the magnetic field of said magnet proximate said component.

5. A sensor, comprising:

a housing;

an electric circuit disposed within said housing, said circuit comprising a magnetically sensitive component connected in electrical communication with said circuit for changing an operating parameter of said circuit in response to a change of the strength of a magnetic field proximate said component;

means for changing said strength of said magnetic field proximate said component a magnet disposed proximate said component within said housing, said magnet and said component being spaced apart to define a gap therebetween, said housing having a depression formed in a wall thereof and extending into said gap and shaped to receive a magnetic article therein to affect the strength of said magnetic field proximate said component and cause a change of said operating parameter.

6. The sensor of claim 5, wherein:

said component is a Hall effect device.

* * * * *